(12) United States Patent
Jiang et al.

(10) Patent No.: US 9,634,690 B2
(45) Date of Patent: Apr. 25, 2017

(54) METHOD AND APPARATUS FOR ARBITRARY RESOLUTION VIDEO CODING USING COMPRESSIVE SAMPLING MEASUREMENTS

(75) Inventors: Hong Jiang, Warren, NJ (US); Chengbo Li, Houston, TX (US); Paul Wilford, Bernardsville, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 1014 days.

(21) Appl. No.: 12/894,807

(22) Filed: Sep. 30, 2010

(65) Prior Publication Data
US 2012/0082208 A1 Apr. 5, 2012

(51) Int. Cl.
H04N 7/32 (2006.01)
H03M 7/30 (2006.01)
(Continued)

(52) U.S. Cl.
CPC .......... H03M 7/3062 (2013.01); H04N 19/44 (2014.11); H04N 19/90 (2014.11)

(58) Field of Classification Search
CPC .......... H04N 19/40; H04N 5/14; H04N 19/61; H04N 1/00822; H04N 1/4172;
(Continued)

(56) References Cited

U.S. PATENT DOCUMENTS 3,775,602 A 11/1973 Alexandridis et al.
5,070,403 A 12/1991 Wilkinson
(Continued)

FOREIGN PATENT DOCUMENTS

CN 101309404 A 11/2008
CN 101964910 A 2/2011
(Continued)

OTHER PUBLICATIONS

U.S. Office Action dated Mar. 4, 2013, for U.S. Appl. No. 12/894,855.
(Continued)

*Primary Examiner* — Chikaodili E Anyikire
*Assistant Examiner* — Kehinde O Abimbola
(74) *Attorney, Agent, or Firm* — Harness, Dickey & Pierce, P.L.C.

(57) ABSTRACT

The present invention relates to method and apparatus for arbitrary resolution video coding using compressive measurements. The method includes receiving at least one measurement of a set of measurements that was generated at an encoder. The set of measurements represents encoded video data. The method further includes determining a display resolution, where the display resolution is the same or different than an original display resolution. The method further includes determining an expansion matrix based on at least a number of pixels for the determined display resolution, and reconstructing the video data using the determined expansion matrix such that the original display resolution is resized to the determined display resolution if the determined display resolution is different than the original display resolution. The expansion matrix includes a pattern of values.

20 Claims, 8 Drawing Sheets

(51) Int. Cl.
*H04N 19/44* (2014.01)
*H04N 19/90* (2014.01)

(58) Field of Classification Search
CPC ......... H04N 2201/212; H04N 5/23245; H04N 5/343; H04N 19/59; H04N 19/132; H04N 19/176; H04N 19/122
USPC .......................................................... 375/240
See application file for complete search history.

(56) References Cited

U.S. PATENT DOCUMENTS

| | | | |
|---|---|---|---|
| 5,166,788 | A | 11/1992 | Lee |
| 5,262,854 | A * | 11/1993 | Ng ........................... 375/240.24 |
| 5,555,023 | A | 9/1996 | Maenaka et al. |
| 5,572,552 | A | 11/1996 | Dent et al. |
| 5,870,144 | A | 2/1999 | Guerrera |
| 5,983,251 | A * | 11/1999 | Martens et al. .............. 708/203 |
| 6,148,107 | A | 11/2000 | Ducloux et al. |
| 6,356,324 | B1 * | 3/2002 | Nishiguchi et al. .......... 349/117 |
| 6,718,287 | B2 | 4/2004 | Oostveen et al. |
| 6,806,903 | B1 | 10/2004 | Okisu et al. |
| 6,954,501 | B2 | 10/2005 | Skripin et al. |
| 7,046,853 | B2 * | 5/2006 | Okada ........................... 382/233 |
| 7,227,895 | B1 * | 6/2007 | Wang .................. H04N 19/159 375/240.13 |
| 7,345,603 | B1 | 3/2008 | Wood et al. |
| 7,680,356 | B2 | 3/2010 | Boyce et al. |
| 8,125,883 | B2 | 2/2012 | Aulin |
| 8,204,126 | B2 | 6/2012 | Tsuda et al. |
| 2002/0181789 | A1 * | 12/2002 | Okada ........................... 382/233 |
| 2003/0017846 | A1 * | 1/2003 | Estevez .................. H04N 19/59 455/556.1 |
| 2003/0043918 | A1 * | 3/2003 | Jiang et al. .............. 375/240.25 |
| 2003/0152147 | A1 | 8/2003 | Akimoto et al. |
| 2003/0197898 | A1 | 10/2003 | Battiato et al. |
| 2004/0264580 | A1 | 12/2004 | Chiang Wei Yin et al. |
| 2005/0207498 | A1 * | 9/2005 | Vitali et al. .............. 375/240.16 |
| 2006/0203904 | A1 * | 9/2006 | Lee ........................... 375/240.1 |
| 2006/0239336 | A1 | 10/2006 | Baraniuk et al. |
| 2007/0047838 | A1 * | 3/2007 | Milanfar .................. G06K 9/40 382/289 |
| 2007/0242746 | A1 * | 10/2007 | Kishimoto et al. ........... 375/240 |
| 2007/0285554 | A1 | 12/2007 | Givon |
| 2008/0025624 | A1 | 1/2008 | Brady |
| 2008/0117968 | A1 | 5/2008 | Wang |
| 2008/0130883 | A1 | 6/2008 | Agaian et al. |
| 2008/0152296 | A1 * | 6/2008 | Oh et al. ......................... 386/47 |
| 2009/0010337 | A1 * | 1/2009 | Wang .................... H04N 19/61 375/240.16 |
| 2009/0010338 | A1 * | 1/2009 | Wang .................. H04N 19/563 375/240.16 |
| 2009/0052585 | A1 | 2/2009 | Song et al. |
| 2009/0079876 | A1 | 3/2009 | Takeshima et al. |
| 2009/0222226 | A1 | 9/2009 | Baraniuk et al. |
| 2009/0316779 | A1 * | 12/2009 | Fukuhara et al. ....... 375/240.02 |
| 2010/0027897 | A1 * | 2/2010 | Sole et al. .................... 382/232 |
| 2010/0040299 | A1 * | 2/2010 | Noh ..................... H04N 19/172 382/233 |
| 2010/0091134 | A1 | 4/2010 | Cooke et al. |
| 2010/0165163 | A1 | 7/2010 | Matsuda |
| 2010/0189172 | A1 | 7/2010 | Pateux et al. |
| 2010/0246952 | A1 | 9/2010 | Banner et al. |
| 2011/0096833 | A1 * | 4/2011 | Wang .................. H04N 19/172 375/240.12 |
| 2011/0150084 | A1 | 6/2011 | Choi et al. |
| 2011/0150087 | A1 | 6/2011 | Kim et al. |
| 2011/0276612 | A1 | 11/2011 | Droz et al. |
| 2011/0310972 | A1 * | 12/2011 | Wang .................. H04N 19/159 375/240.16 |
| 2012/0051432 | A1 | 3/2012 | Fernandes et al. |
| 2012/0063641 | A1 | 3/2012 | Venkatesh et al. |
| 2012/0082208 | A1 | 4/2012 | Jiang et al. |
| 2012/0114039 | A1 * | 5/2012 | Wang .................. H04N 19/197 375/240.13 |
| 2012/0189047 | A1 | 7/2012 | Jiang et al. |
| 2013/0121422 | A1 | 5/2013 | Jiang et al. |
| 2014/0043491 | A1 | 2/2014 | Jiang et al. |
| 2015/0178945 | A1 | 6/2015 | Haimi-Cohen et al. |
| 2016/0021390 | A1 | 1/2016 | Haimi-Cohen |

FOREIGN PATENT DOCUMENTS

| | | |
|---|---|---|
| CN | 102025999 A | 4/2011 |
| JP | 2003-069832 A | 3/2003 |
| WO | WO 2009/007580 A2 | 1/2009 |
| WO | WO 2011/081643 A2 | 7/2011 |

OTHER PUBLICATIONS

International Search Report mailed Feb. 29, 2012.
CCD and CMOS sensor technology, 2010, Axis Communications, pp. 1-8.
Jan Bogaerts et al., High-End CMOS Active Pixel Sensors for Space-Borne Imaging Instruments, 2005, FillFactory, pp. 1-9.
Roger William Doering, A Tricolor-Pixel Digital-Micromirror Video Chip, 2001, UCLA, pp. 1-180.
Tarek Ouni et al., New low complexity DCT based video compression method, 2009, IEEE 09, pp. 202-207.
R. Turchetta et al., Monolithic active pixel sensors (MAPS) in a VLSI CMOS technology, 2003, Science Direct, pp. 251-259.
Sahng-Gyu Park, Adaptive Lossless Video Compression, 2003, Purdue University, pp. 1-105.
Office Action dated Oct. 1, 2012 for co-pending U.S. Appl. No. 12/894,855.
Office Action dated Dec. 4, 2012 for co-pending U.S. Appl. No. 12/894,757.
U.S. Appl. No. 12/894,757, filed Sep. 30, 2010.
U.S. Appl. No. 12/894,855, filed Sep. 30, 2010.
U.S. Appl. No. 13/182,856, filed Jul. 14, 2011.
U.S. Appl. No. 13/213,743, filed Aug. 19, 2011.
U.S. Appl. No. 13/213,762, filed Aug. 19, 2011.
U.S. Appl. No. 14/136,335, filed Dec. 20, 2013.
U.S. Appl. No. 14/136,803, filed Dec. 20, 2013.
U.S. Appl. No. 14/332,076, filed Jul. 15, 2014.
U.S. Final Office Action dated Aug. 27, 2014, for U.S. Appl. No. 13/182,856.
U.S. Final Office Action dated Dec. 4, 2014, for U.S. Appl. No. 13/213,762.
U.S. Final Office Action dated Dec. 10, 2014, for U.S. Appl. No. 13/213,743.
U.S. Office Action dated May 29, 2015, for U.S. Appl. No. 13/213,743.
U.S. Office Action dated Jun. 4, 2015, for U.S. Appl. No. 13/213,762.
U.S. Office Action dated Jun. 26, 2015, for U.S. Appl. No. 13/182,856.
Notice of Allowance dated Sep. 30, 2013, in copending U.S. Appl. No. 12/894,855.
Notice of Allowance dated Apr. 17, 2014, in copending U.S. Appl. No. 12/894,757.
Notice of Allowance dated Sep. 12, 2014, in copending U.S. Appl. No. 12/894,757.
Notice of Allowance dated Nov. 20, 2014, in copending U.S. Appl. No. 12/894,757.
International Search Report for PCT/US2014/066035 dated Feb. 26, 2015.
Written Opinion of the International Searching Authority for PCT/US2014/066035 dated Feb. 26, 2015.
Chinese Office Action dated Jun. 3, 2015, in Chinese Application No. 201180047658.2, corresponding to U.S. Appl. No. 12/894,807.
L.R. Rabiner and B. Gold, Theory and Application of Digital Signal Processing, ch. 6, sec. 6.17, pp. 393-399. Prentice Hall, 1975.
Huang, Gang et al. "Lensless Compressive Sensing Imaging," Jan. 2013, pp. 1-12.
Narayanan, S. et al., "Camera Motion Estimation using Circulant Compressive Sensing Matrices", 2013 $9^{th}$ International Conference (56) References Cited

OTHER PUBLICATIONS on Information, Communications & Signal Processing, IEEE, Dec. 10, 2013, pp. 1-5 (XP032584530).
Majumdar, A., "A sparsity based approach towards fast MRI acquisition", Jul. 19, 2012 (XP055123105).
Willett, R. M. et al., "Compressed sensing for practical optical imaging systems: a tutorial", SPIE, Optical Engineering, vol. 50, No. 7, Jul. 6, 2011, pp. 1-13 (XP040561676).
Cossalter M. et al., "Joint Compressive Video Coding and Analysis," IEEE Transactions on Multimedia, IEEE Service Center, Piscataway, NJ, US, vol. 12, No. 3, Apr. 1, 2010, pp. 168-183, XP011346672.
Dadkhan M.R. et al., "Compressive Sensing with Modified Total Variation Minimization Algorithm," Acoustic Speech and Signal Processing (ICASSP), 2010 IEEE International Conference on, IEEE, Piscataway, NJ, USA, Mar. 14, 2010, pp. 1310-1313, XP031697373.
Huihui Bai et al., "Compressive Sensing for DCT Image," Computational Aspects of Social Networks (CASON), 2010 International Conference On, IEEE, Piscataway, NJ, USA, Sep. 26, 2010, pp. 378-381, XP031802282.
Duarte M.F. et al., "Single-Pixel Imaging via Compressive Sampling," IEEE Signal Processing Magazine, IEEE Service Center, Piscataway, NJ, US, vol. 25, No. 2, Mar. 1, 2008, pp. 83-91, XP011225667.
Chengbo Li, "An Efficient Algorithm for Total Variation Regularization with Applications to the Single Pixel Camera and Compressive Sensing," Thesis Submitted in Partial Fulfillment of the Requirements for the Degree Master of Arts, Sep. 30, 2009, pp. 1-93, XP55010819, Retrieved from the internet: URL:http://scholarship.rice.edu/bitstream/handle/1911/62229/1486057.
PDF?sequence=1 [Retrieved Oct. 31, 2011].
Chengbo Li et al., "Video Coding Using Compressive Sensing for Wireless Communications," Wireless Communications and Networking Conference (WCNC), 2011 IEEE, IEEE, Mar. 28, 2011, pp. 2077-2082, XP031876593.
Hong Jiang et al., "Arbitrary Resolution Video Coding Using Compressive Sensing," Workshop on Picture Coding and Image Processing 2010, Dec. 7, 2010 XP030082080.
International Search Report dated Nov. 14, 2011 for Application No. PCT/US2011/051726.
Robucci, Ryan, et al., "Compressive Sensing on a CMOS Seperable Transform Image Sensor," pp. 5125-5128, IEEE, 2008.
International Search Report and Written Opinion for PCT/US2011/051730 dated Dec. 15, 2011.
Dugad, R. et al., "A Fast Scheme for Image Size Change in the Compressed Domain," IEEE Transactions on Circuits and Systems for Video Technology, vol. 11, No. 4, Apr. 1, 2011.
Deng, C. et al., "Robust image compression based on compressive sensing," Multimedia and Expo (ICME), Jul. 19, 2012, pp. 462-467.
Hyder, M. et al., "A Scalable Distributed Video Coder Using Compressed Sensing," India Conference, Dec. 8, 2009, pp. 1-4.
Gao, D. et al., "A Robust Image Transmission Scheme for Wireless Channels Based on Compressive Sensing," Aug. 18, 2012, pp. 334-341.
International Search Report dated Feb. 29, 2012.
U.S. Office Action dated Mar. 20, 2013, for U.S. Appl. No. 12/894,757.
International Preliminary Report on Patentability and Written Opinion of the International Searching Authority for PCT/US2011/051726 dated Apr. 11, 2013.
International Preliminary Report on Patentability and Written Opinion of the International Searching Authority for PCT/US2011/051730 dated Apr. 11, 2013.
International Preliminary Report on Patentability and Written Opinion of the International Searching Authority for PCT/US2011/056088 dated Apr. 11, 2013.
Office Action dated Feb. 13, 2014, in related U.S. Appl. No. 13/182,856.
U.S. Office Action dated Aug. 16, 2013, for U.S. Appl. No. 13/182,856.
U.S. Office Action dated Sep. 25, 2013, for U.S. Appl. No. 12/894,757.
U.S. Office Action dated Jun. 18, 2014, for U.S. Appl. No. 13/213,743.
U.S. Office Action dated Jul. 9, 2014, for U.S. Appl. No. 13/213,762.
Japanese Office Action dated Feb. 25, 2014, mailed in JP 2013-531973 (translation).
Park and Wakin, "A multiscale framework for compressive sensing of video," in Picture Coding Simposium, Chicago, IL, May 2009.
Drori, Idde, "Compressed Video Sensing", BMVA symposium on 3D video analysis, display, and applications, 2008.
Wakin et al., "Compressive imaging for video representation and coding", in Picture Coding Symposium, (Beijing, China), Apr. 2006.
Budhaditya et al., "Effective anomaly detection in sensor networks data streams", Dec. 9, 2009, IEEE, 9th IEEE International Conference on Data Mining, pp. 722-727.

* cited by examiner

METHOD AND APPARATUS FOR ARBITRARY RESOLUTION VIDEO CODING USING COMPRESSIVE SAMPLING MEASUREMENTS

BACKGROUND

In a video network, a video source may be transmitted to multiple client devices with different characteristics. The client devices in the video network may have different channel capacities, different display resolutions, and different computing resources. For example, a video source may be transmitted through the video network to a high performance computer with high resolution monitors in a residential home, and at the same time, to a mobile device with a low resolution screen and with a battery powered CPU. Therefore, it is desirable for a video source to be encoded in such a way that the same encoded video stream can be transmitted, and be usable by all clients, of different characteristics, in the network. In other words, it is desirable to encode the video source once, but to transmit the same encoded video at different channel rates, and to decode it at different resolutions, and with different complexities.

Traditional video coding such as MPEG2 does not provide the scalability desired for today's video network as described above. The lack of scalability exhibits itself in at least two ways. First, an MPEG2 encoded video is not scalable with transmission channel capacity. Because of its fixed bit rate, an encoded MPEG2 stream is unusable in a channel supporting a lower bit rate, and at the same time, suboptimal in a channel with higher bit rate. This is the cause of the cliff effect encountered in video broadcast or multicast. Second, the MPEG2 video is not scalable with decoder resolution or decoding complexity. An MPEG2 video can be decoded only at one resolution, with a fixed complexity (not considering post-processing such as resizing, or enhancement, after decoding). This creates the need for multiple encoded streams of the same video content to target decoders of different resolutions.

Efforts have been made to introduce scalability into video coding. However, these conventional efforts encode video data into ordered layers, or levels, of streams, and the resolution, or quality, of the decoded video increases progressively as higher layers, or levels, are added to the decoder. Hierarchical modulation may be used in conjunction with these scalable video codes to achieve more bandwidth efficiency. For example, the high priority of hierarchical modulation can be used to carry the lower layer video streams, and low priority of hierarchical modulation can be used to carry the higher layer of video streams. These efforts have provided some alleviation to problems such as the cliff effect in video transmission using the traditional video coding, but challenges of mobile video broadcast still remain.

SUMMARY

The present invention relates to method and apparatus for arbitrary resolution video coding using compressive measurements.

The method includes receiving at least one measurement of a set of measurements that was generated at an encoder. The set of measurements represents encoded video data. The method further includes determining a display resolution, where the display resolution is the same or different than an original display resolution. The method further includes determining an expansion matrix based on at least a number of pixels for the determined display resolution, and reconstructing the video data using the determined expansion matrix such that the original display resolution is resized to the determined display resolution if the determined display resolution is different than the original display resolution. The expansion matrix includes a pattern of values.

The display resolution may be determined according to requirements of a video display screen. Also, the display resolution may be determined according to a number of the received measurements.

The method may further include obtaining a measurement matrix that was applied to the video data at an encoder, the measurement matrix including an assigned pattern of pixel values, and calculating pixel values for the determined display resolution according to a total variation (TV) of discrete cosine transform (DCT) coefficients of candidate video data. The candidate video data is based on the measurement matrix, the expansion matrix, and the received measurements. The pattern of values of the expansion matrix may represent a low path filter. Also, the pattern of values of the expansion matrix may be calculated using a DCT transform of the video data. Furthermore, the pattern of values of the expansion matrix may be calculated using wavelet transform of the video data. The TV is one of anisotropic TV and isotropic TV.

The calculating step may further include determining the DCT coefficients in a temporal direction of the candidate video data, and determining the TV of the DCT coefficients on a frame-by-frame basis, where the calculating step calculates a set of values according to a minimization of the TV of the DCT coefficients. The assigned pattern of pixel values of the measurement matrix may be constructed based on a lowest display resolution the decoder can reconstruct from the received measurements.

The apparatus includes a decoder configured to receive at least one measurement of a set of measurements that was generated at an encoder and to determine a display resolution, where the display resolution is the same or different than an original display resolution. Also, the decoder is configured to determine an expansion matrix based on at least a number of pixels for the determined display resolution, and to reconstruct the video data using the determined expansion matrix such that the original display resolution is resized to the determined display resolution if the determined display resolution is different than the original display resolution.

Also, the decoder may determine the display resolution according to requirements of a video display screen and/or determine the display resolution according to a number of the received measurements.

The decoder may be configured to obtain a measurement matrix that was applied to the video data at an encoder and to calculate pixel values for the determined display resolution according to a total variation (TV) of discrete cosine transform (DCT) coefficients of candidate video data. The candidate video data is based on the measurement matrix, the expansion matrix, and the received measurements.

The pattern of values of the expansion matrix may represent a low path filter. Also, the pattern of values of the expansion matrix may be calculated using a DCT transform of the video data. Furthermore, the pattern of values of the expansion matrix may be calculated using wavelet transform of the video data. The TV is one of anisotropic TV and isotropic TV.

Also, the decoder may be configured to determine the DCT coefficients in a temporal direction of the candidate video data, and determine the TV of the DCT coefficients on a frame-by-frame basis, where the decoder calculates a set of values according to a minimization of the TV of the DCT coefficients.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the present invention, and wherein.

DETAILED DESCRIPTION OF EXAMPLE EMBODIMENTS

Various embodiments of the present invention will now be described more fully with reference to the accompanying drawings. Like elements on the drawings are labeled by like reference numerals.

As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The present invention will now be described with reference to the attached figures. Various structures, systems and devices are schematically depicted in the drawings for purposes of explanation only and so as not to obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. To the extent that a term or phrase is intended to have a special meaning, i.e., a meaning other than that understood by skilled artisans, such a special definition will be expressly set forth in the specification that directly and unequivocally provides the special definition for the term or phrase.

Embodiments of the present invention provide an arbitrary resolution video coding method based on compressive sampling. For instance, video data is coded using compressive measurements. The compressive measurements are made on video data of high resolution such as High-definition television (HDTV). The measurements from the high resolution video data are transmitted in a network, wired or wireless. When received by a destination device, the measurements may be used to reconstruct the video data at the same resolution as the original video data, and any subset of the measurements may be used to reconstruct the video data at lower resolution with a lower complexity. For example, a destination device in a good channel may correctly receive a sufficient amount of measurements to reconstruct video data of the original resolution. However, a destination device in a poor channel may only correctly receive a subset of measurements fewer than required to reconstruct an acceptable video at high resolution, but the destination device may still use the correctly received measurements to reconstruct an acceptable video of a lower resolution. For instance, the number of received measurements may be too small to reconstruct the video data of the original resolution with an acceptable quality. As such, the ability of arbitrary resolution reconstructions makes the embodiments of the present invention suitable for transmission in all channels. Furthermore, although the present disclosures discusses the display resolution as a reduced display resolution, embodiments of the present invention also cover the situation where the reconstructed display resolution is greater than the original display resolution.

Furthermore, the ability of arbitrary resolution reconstructions makes the embodiments of the present invention suitable for decoding at different complexities, and different display resolutions. The video coding using the present invention is scalable with channel capacity, decoding complexity and display resolution. The scalability provided by the invention does not require any overhead in bit rate, or bandwidth as other methods in state of art.

The first part of this disclosure describes encoding video data using compressive measurements, and then transmitting a set of measurements representing the original video data. The second part of this disclosure describes decoding the encoded video data by reconstructing the video data according to a reduced display resolution that has been determined according to the requirements of video display of a destination device and/or a number of correctly received measurements.

Figure 1:
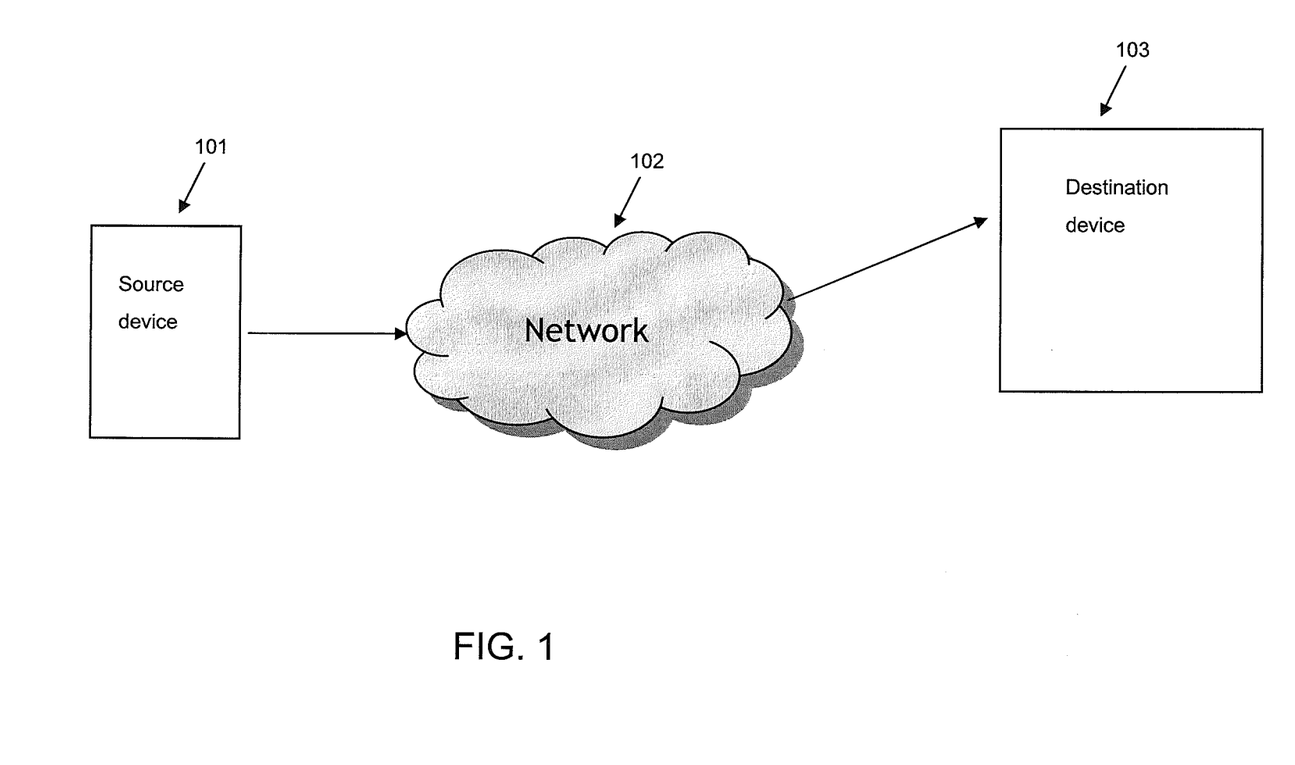
FIG. 1 illustrates a communication network according to an embodiment of the present invention.

FIG. 1 illustrates a communication network according to an embodiment of the present invention. The communication network includes at least one source device 101 for acquiring, encoding and/or transmitting video data, a network 102 supporting a video transmission application, and at least one destination device 103 for receiving, decoding and/or displaying the received video data. The network 102 may be any known transmission, wireless or wirelined, network. For example, the network 102 may be a wireless network which includes a radio network controller (RNC), a base station (BS), or any other known component necessary for the transmission of video data over the network 102 from one device to another device. The video transmission application part of the network 102 may include Digital Video Broadcasting-Handheld (DVB-H), Digital Video Broadcasting-Satellite services to Handhelds (DVB-SH), Long Term Evolution (LTE) or evolved Multimedia Broadcast and Multicast Services (eMBMS), for example. One device may transmit video information to another device via a dedicated or shared communication channel.

The source device 101 may be any type of device capable of acquiring video data and encoding the video data for transmission via the network 102 such as personal computer systems, camera systems, mobile video phones, smart phones, or any type of computing device that may connect to the network 102, for example. Each source device 101 includes at least one processor, a memory, and an application storing instructions to be carried out by the processor. The acquisition, encoding, transmitting or any other function of the source device 101 may be controlled by at least one processor. However, a number of separate processors may be provided to control a specific type of function or a number of functions of the source device 101. The implementation of the controller(s) to perform the functions described below is within the skill of someone with ordinary skill in the art.

The destination device 103 may be any type of device capable of receiving, decoding and displaying video data such as personal computer systems, mobile video phones, smart phones or any type of computing device that may receive video information from the network 102. The receiving, decoding, and displaying or any other function of the destination device 103 may be controlled by at least one processor. However, a number of separate processors may be provided to control a specific type of function or a number of functions of the destination device 103. The implementation of the controller(s) to perform the functions described below is within the skill of someone with ordinary skill in the art.

Figure 2:
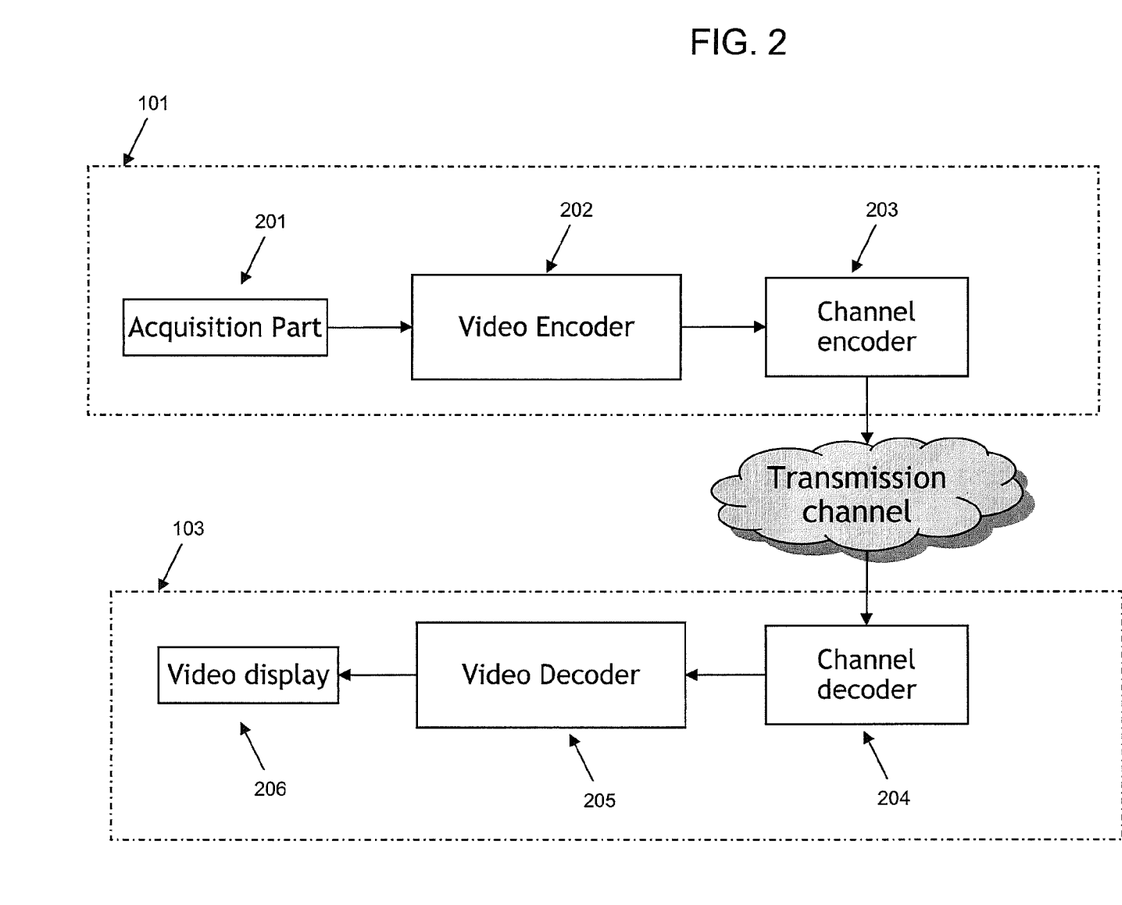
FIG. 2 illustrates components of a source device and destination device according to an embodiment of the present invention.

FIG. 2 illustrates components of the source device 101 and the destination device 103 according to an embodiment of the present invention. For example, the source device 101 includes an acquisition part 201, a video encoder 202, and a channel encoder 203. In addition, the source device 101 may include other components that are well known to one of ordinary skill in the art. Referring to FIG. 2, the acquisition part 201 acquires video data from a video camera component included in the source device 101 or connected to the source device 101. Also, the source device 101 may acquire video data from any type of computer-readable medium such as optical disks and/or any type of memory storage unit. The acquisition of video data may be accomplished according to any well known methods.

According to an embodiment of the present invention, the video encoder 202 encodes the acquired video data using compressive measurements to generate a set of measurements, which represents the encoded video data. For example, the video encoder 202 may apply a set of measurement bases to the original video data in its original form or a modified temporal structure such as video cubes, tubes or any type of video structure to generate a set of measurements to be stored on a computer-readable medium such as an optical disk or storage unit or to be transmitted to the destination device 103. The video encoder 202 is further explained with reference to FIG. 3 of the present invention.

Using the set of measurements, the channel encoder 203 codes the measurements to be transmitted in the communication channel. For example, the measurements are quantized to integers. The quantized measurements are packetized into transmission packets. Additional parity bits are added to the packets for the purpose of error detection and/or error correction. It is well known in the art that the measurements thus coded can be transmitted in the network 102.

Next, the source device 101 may transmit the encoded video data to the destination device via the communication channel of the network 102.

The destination device 103 includes a channel decoder 204, a video decoder 205, and a video display 206. The destination device 103 may include other components that are well known to one of ordinary skill in the art.

The channel decoder 204 decodes the data received from communication channel. For example, the data from the communication channel is processed to detect and/or correct errors from the transmission by using the parity bits of the data. The correctly received packets are unpacketized to produce the quantized measurements made in the video encoder 202. It is well known in the art that data can be packetized and coded in such a way that a received packet at the channel decoder 204 can be decoded, and after decoding the packet can be either corrected, free of transmission error, or the packet can be found to contain transmission errors that cannot be corrected, in which case the packet is considered to be lost. In other words, the channel decoder 204 is able to process a received packet to attempt to correct errors in the packet, and to determine whether or not the processed packet has errors, and to forward only the correct measurements from an error free packet to the video decoder 205.

The video decoder 205 determines a display resolution according to the display requirements of the destination device 103 and/or a number of correctly received measurements. For example, the destination device 103 may have a small display screen, and therefore, it only needs the video to be reconstructed at a reduced display resolution even if enough measurements are received to reconstruct the video with a higher resolution with an acceptable quality. In addition, the video decoder 205 may be located in a bad reception area. As a result, the video decoder 205 may receive only a sub-set of the transmitted measurements, which are not enough to reconstruct the video data at its original display resolution. As such, the video decoder 205 determines the reduced resolution display resolution according to the number of correctly received measurements. The decoding processing is further explained with reference to FIGS. 4-8.

The video display 206 may be a video display screen of a particular size. The video display 206 may be included in the destination device 103, or may be connected (wirelessly, wired) to the destination device 103. The destination device 103 displays the decoded video data on the video display 206 of the destination device 103 according to the determined display resolution size.

Figure 3:
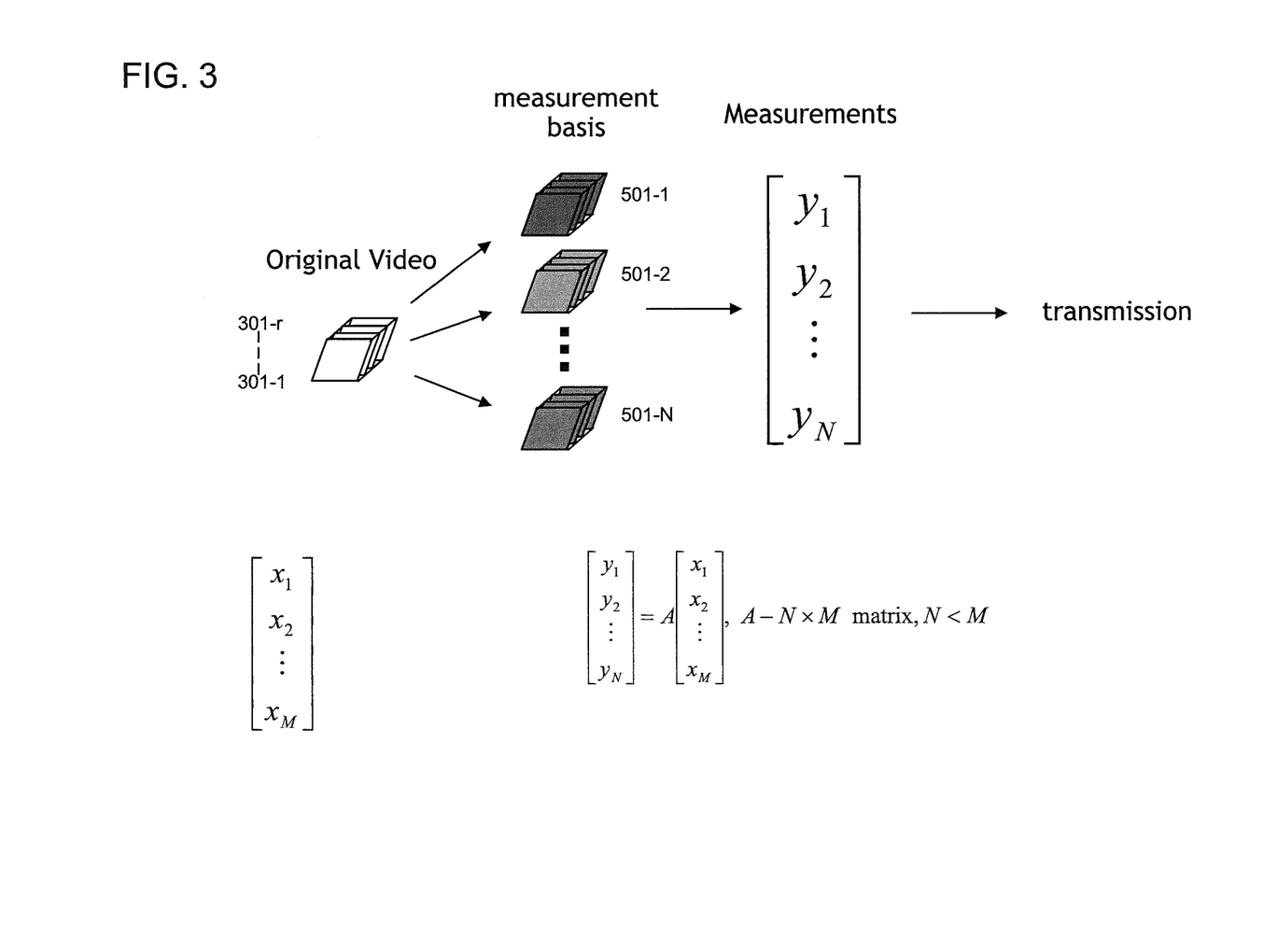
FIG. 3 illustrates an encoding process that applies the set of measurement bases to the original video data according to an embodiment of the present invention.

FIG. 3 illustrates a method of encoding the acquired video data using compressive measurements by the video encoder 202 according to an embodiment of the present invention.

The original video data includes a number of consecutive frames 301-1 to 301-$r$, where r may be any integer. Each frame 301 of the video data has size P×Q, where P and Q are the number of horizontal and vertical pixels in each frame. Also, the video encoder 202 may convert the original video frames 301 into a structure different than the structure of the video frames 301. For instance, the video encoder 202 may form the original video frames 301 into different temporal structure. For example, the temporal structure may include a sub-block of video data extracted from each frame in a number of consecutive frames. The temporal structure may be one of video cubes or video tubes, as further explained below.

In the case of video cubes, the video encoder 202 extracts a 2-D non-overlapping block of video data from each of the video frames 301 in the number of consecutive frames 301-1 to 301-r. The 2-D non-overlapping block represents a sub-region of each video frame. Each block for each frame 301 may have the same number of pixels and the blocks may be extracted from the same location in each of the consecutive frames 301. The video encoder 202 forms the video cube by stacking each extracted block to form a three dimensional (3-D) video structure. Encoding is performed cube by cube on all video cubes that comprises the received video data.

In the case of video tubes, the video encoder 202 extracts a non-overlapping 2-D block of video data from at least one video frame 301 in a group of pictures (GOP). For example, the video tube includes non-overlapping 2-D blocks extracted from the video frames 301, which may follow the motion trajectory of a particular object in the GOP. The object may be a meaningful object in the video image such as an image of a person as he moves through the video frames 301 of the GOP. Each video tube may include extracted blocks that have different shapes and sizes, and may have different locations within their respective frames. Also, different video tubes may include a different number of frames. The video encoder 202 forms the video tubes by stacking each extracted block to form a 3-D video structure. Encoding is performed tube by tube on all video tubes that comprises the received video data.

The video encoder 202 applies a set of measurement bases to the temporal structure of the video data. For example, the video encoder 202 applies a set of measurement bases 501-1 to 501-N to the video frames 301 (e.g., frames in its original structure) to obtain a set of measurements $y_1$ to $y_N$. Variable N may be any integer greater or equal to 1. Each value of y represents a compressive measurement. A number of measurement bases N applied to the video frames 301 corresponds to a number of measurements N. A description of how compressive measurements are calculated is explained below.

First, the video encoder 202 scans the pixels of the video frames 301 to obtain vector $x \in \Re^m$, which is a 1-D representation of the video frames 301 comprising the video data, where $m = p \times q \times r$ is the length of the vector x. The vector x includes the pixel values of the video frames 301, which is arranged as $[x_1 \; x_2 \; \ldots \; x_m]$. As shown in FIG. 3, the 1-D representation vector x may be multiplied by measurement matrix A to obtain the set of measurements $y_1$ to $y_N$. The measurement matrix A includes an assigned pattern of pixel values. Each column of the measurement matrix A represents a separate measurement basis. For instance, the measurement matrix A is graphically represented by the set of measurement bases 501-1 to 501-N. The measurement matrix A may be interchangeably used with the set of measurements 501-1 to 501-N. The length of vector x is m, which is also the number of pixels in the video frames 301.

The values of the measurement matrix A may be constructed using randomly permutated Walsh-Hadamard matrix. However, embodiments of the present invention encompass any type of matrix for use as the measurement matrix A. As such, the N compressive measurements of vector x is the vector $y \in \Re^m$ defined by $y = Ax$. Measurement matrix A has dimension N×m, where N is the number of measurements, and m is the length of the vector x, i.e., m is the number of pixels in the video frames 301. Furthermore, the measurement matrix A may be constructed using Kronecker products, which is further explained below.

The video encoder 202 outputs the set of measurements $y_1$ to $y_N$ to the channel encoder 203. The channel encoder 203 encodes the set of measurements $y_1$ to $y_N$ for transmission to the destination device 103 in a manner that was previously described. Next, the source device 101 transmits the set of measurements $y_1$ to $y_N$ to the destination device 103 via the communication channel of the network 102.

The channel decoder 204 of the destination device 101 decodes the transmission, and forwards the correctly received measurements to the video decoder 205 in a manner that was previously described above.

The video decoder 205 determines the video display resolution according to the type of display area of the destination device and/or the number of correctly received measurements. The video decoder 205 reconstructs the video data at the determined display resolution.

Figure 4:
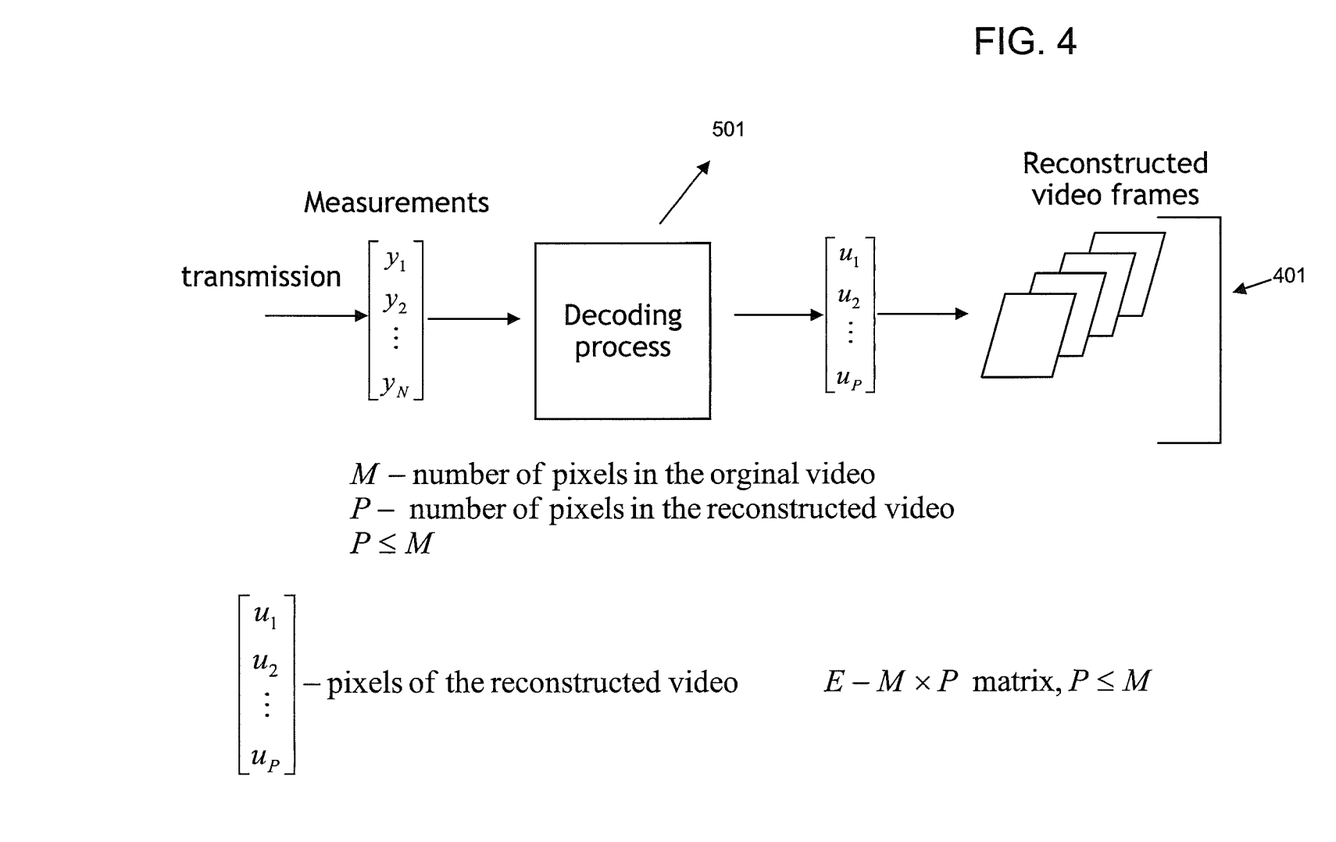
FIG. 4 illustrates a reconstruction process by the video decoder 205 according to an embodiment of the present invention.

FIG. 4 illustrates a reconstruction process by the video decoder 205 according to an embodiment of the present invention. The video decoder 205 receives at least one correctly received measurement of the set of measurements $y_1$ to $y_N$. The video decoder 205 determines the display resolution to reconstruct the video data. This feature is further described below. The video decoder 205 calculates pixel values $[u_1, u_2 \ldots u_p]$ for the reconstructed video data in the determined display resolution according to a decoding process 501, which uses an expansion matrix E. The expansion matrix includes a pattern of values. For example, the expansion matrix E is constructed as M×P, where M is the number of pixels in the original video data, and P is the number of pixels in the reconstructed video data. P may be less than or equal to M. The video decoder 205 then reconstructs the video frames 401 based on at least the expansion matrix E such that the original display resolution is resized to the determined display resolution if the determined display resolution is different than the original display resolution, as further explained below.

Figure 5:
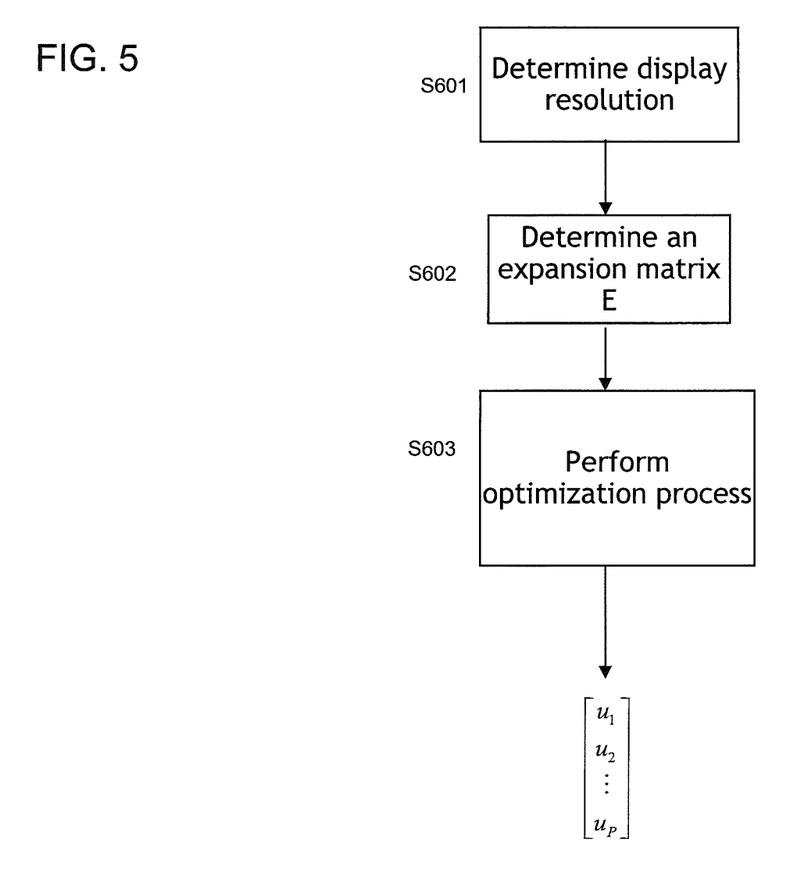
FIG. 5 illustrates a method for decoding the received measurements by the video decoder according to an embodiment of the present invention.

FIG. 5 illustrates a method for decoding the received measurements by the video decoder according to an embodiment of the present invention.

In S601, the video decoder 205 determines the video display resolution to reconstruct the encoded video data according to the type of the video display 206 and/or the number of correctly received measurements. For example, the video decoder 205 may determine the size of the video display 206, and then reduce the original video display resolution to fit the size of the video display 206.

In addition, the video decoder 205 may determine the display resolution according to a number of correctly received measurements. For example, at least one of the reduced display resolutions may be determined according to $N \geq c \cdot k \cdot \log(M)$, where N is the number of available measurements, c is a fixed constant, k is a sparsity variable, and M is the number of pixels in the original video data. For example, the fixed constant c and the sparsity variable k may be any type of value chosen by the designer. Embodiments of the present invention may use the above-identified equation determine the reduced display resolution. However, embodiments of the present invention also encompass any other type of method for determining the reduced display resolutions.

Figure 6:
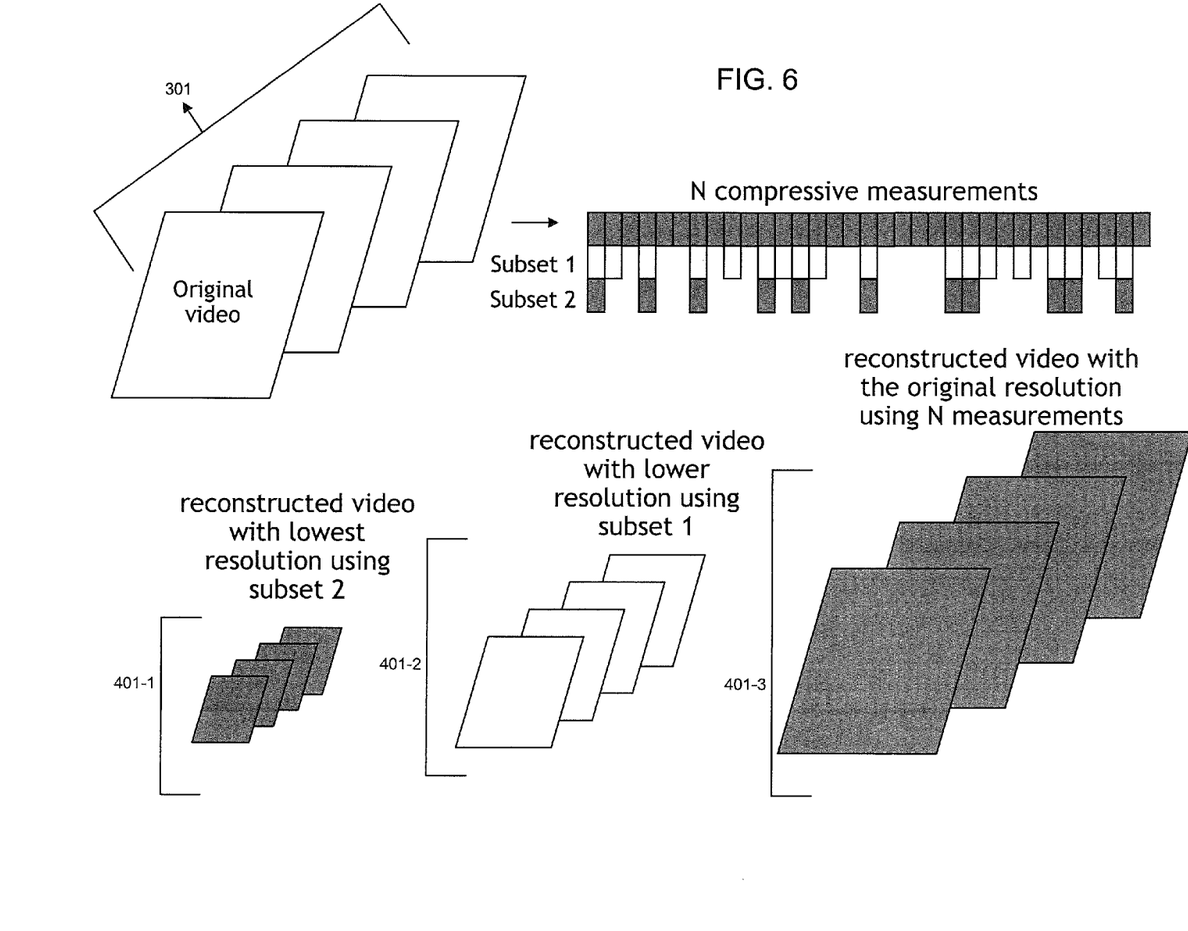
FIG. 6 illustrates a diagram showing the reconstructed video according to different types of resolutions according to an embodiment of the present invention.

FIG. 6 illustrates a diagram showing the reconstructed video according to different types of resolutions according to an embodiment of the present invention. For example, the video decoder 205 may reconstruct the video data according to determined display resolution 401-1 or 402-2 (e.g., a first or second display resolution), which are different from the original display resolution 401-3. For instance, the N compressive measurements shown in FIG. 4 comprise the total number of measurements that were generated at the video encoder 202. However, depending on the quality of the channel, the video decoder 205 may receive substantially all the N compressive measurements, or only a subset of the N compressive measurements (e.g., subset 1 and subset 2). If the video decoder 205 receives a subset of the N compressive measurements, the destination device 103 may not be able to display the video data according to its original resolution. As such, the video decoder 205 may reconstruct the video data according to the first reduced display resolution 401-1 or the second reduced display resolution 401-2 if the number of correctly received measurements is less than the set of measurements N. Also, embodiments of the present invention encompass any number and type of display resolutions.

Referring back to FIG. 5, in S602, the video decoder 205 determines an expansion matrix E to be used in the optimization process of step S603. The expansion matrix E is based on at least a number of pixels for the determined display resolution. For example, as indicated above, the expansion matrix E is $M \times M_L$, where M is the number of pixels in the original video data, and $M_L$ is the number of pixels in the reconstructed video data that has the determined display resolution.

The expansion matrix includes a pattern of values, which may be determined by using any known resizing method. For example, in one example, the pattern of values of the expansion matrix E is calculated from a reduction matrix R representing a low path filter. R may be an $M \times M_L$ matrix representing the process of lowpass filtering and downsampling, for example, by taking pixel averages, or using a poly-phase filter. The reduction matrix R may also be construct from a two dimensional (2D) spatial discrete cosine transform (DCT) or wavelet transform of the original video frames by using only the low frequency components. The reduction matrix R may have the full rank, and therefore, the expansion matrix E can be obtained from the one-sided inverse of the reduction matrix R, as $$E = R^T (RR^T)^{-1}.$$

The expansion matrix E can also be explicitly constructed by using the DCT transform. Let $T_m$ be the $M \times M$ matrix representing the DCT transform of size N, and $I_{m \times m_L}$ be the $M \times M_L$ matrix obtained from an $M_L \times M_L$ identity matrix by inserting $M - M_L$ rows of zeros. Then an expansion matrix is given by $$E = T_M^T I_{M \times M_L} T_{M_L}.$$

Also, the expansion matrix E may be constructed from a wavelet transform in similar to the expansion matrix discussed above.

In S603, the video decoder 205 calculates the pixel values $[u_1, u_2 \ldots u_{mL}]$ for the reduced display resolution according to a minimization equation that uses the determined expansion matrix and the received measurements, as further explained below.

For example, the video decoder 205 solves one of the following minimization equations, which is performed by a minimization of two-dimensional (2D) total variation (e.g., a TV function) of 1-dimensional (1D) DCT coefficients in the time domain.

$$\min_x TV_2(DCT_t(u)), \text{ subject to } y = AEu, \text{ or} \qquad \text{Equation 1}$$

$$\min_x TV_2(DCT_t(u)) + \frac{\mu}{2} \|AEu - y\|_2^2 \qquad \text{Equation 2}$$

In both equations, y is the available measurements for the set of measurements $y_1$ to $y_N$, and A is the measurement matrix, i.e., 501-1, 501-N, u is the vector $[u_1 \, u_2 \ldots u_{mL}]$, which is the pixel values for the reconstructed video frames, E is the expansion matrix E as previously described. The decoder 205 obtains the measurement matrix A that was applied to the video data at the encoder 202. For example, the measurement matrix A may be obtained based on information that was transmitted from the source device 101, or maybe be obtained from a storage unit that stores the measurement matrix A. The variable μ is the penalty parameter. The value of the penalty parameter is a design choice. $DCT_t(x)$ is a 1-D DCT transform in the time domain, and $TV_2(z)$ is a 2-D total variation function, where z represents the results of the 1-D DCT function. The decoder 205 solves values of x using either Equation 1 or Equation 2.

Equation 2 is an alternative way of expressing Equation 1. However, the video decoder 205 may implement either Equation 1 or Equation 2 according to methods that are well known. For example, an appropriate solver such as the alternate direction augmented Lagrangian method may be used to implement the above-identified minimization equations. A Lagrange method provides a strategy for finding the maxima and minima of a function subject to constraints.

Therefore, the video decoder 205 computes the pixel values for the reduced display resolution according to one of the minimization equations described above, which uses the determined expansion matrix E, the received measurements and the measurement matrix A. For example, the video decoder 205 reconstructs the video data according to the total variation (TV) of a discrete cosine transform (DCT) coefficients of candidate video data. The candidate video data is based on the measurement matrix A, the expansion matrix E and the received measurements. For example, in y=AEx, the received measurements y and the measurement matrix A are known. The expansion matrix E has been previously determined.

The creation of Equation 1 and Equation 2 is further described below.

For example, the minimization problem may also be characterized as:

$$\min_x \Phi(u) \text{ subject to } y = AEu, \text{ or} \qquad \text{Equation 1}$$

$$\min_x \Phi(u) + \frac{\mu}{2} \|AEx - y\|_2^2 \qquad \text{Equation 2}$$

$\Phi(x)$ represents the choice of a regularization term and μ is the penalty parameter or the damping factor. If the vector u is sparse, $\Phi(x)$ may be chosen as the $l_1$-norm of the vector u. However, when the vector u includes pixel values of the video frames, it may not be obvious in which basis u is sparse, and further, in which basis, u has the most sparseness.

Embodiments of the present invention use the minimum spatial total variation of time domain DCT coefficients of the original video frame as the regulation term, which is provided in the following equation $\Phi(u) = TV_s(DCT_t(u))$. $DCT_t(u)$ represents the pixel wise DCT in the temporal direction, and each frame consists of DCT coefficients of a particular frequency.

Figure 7:
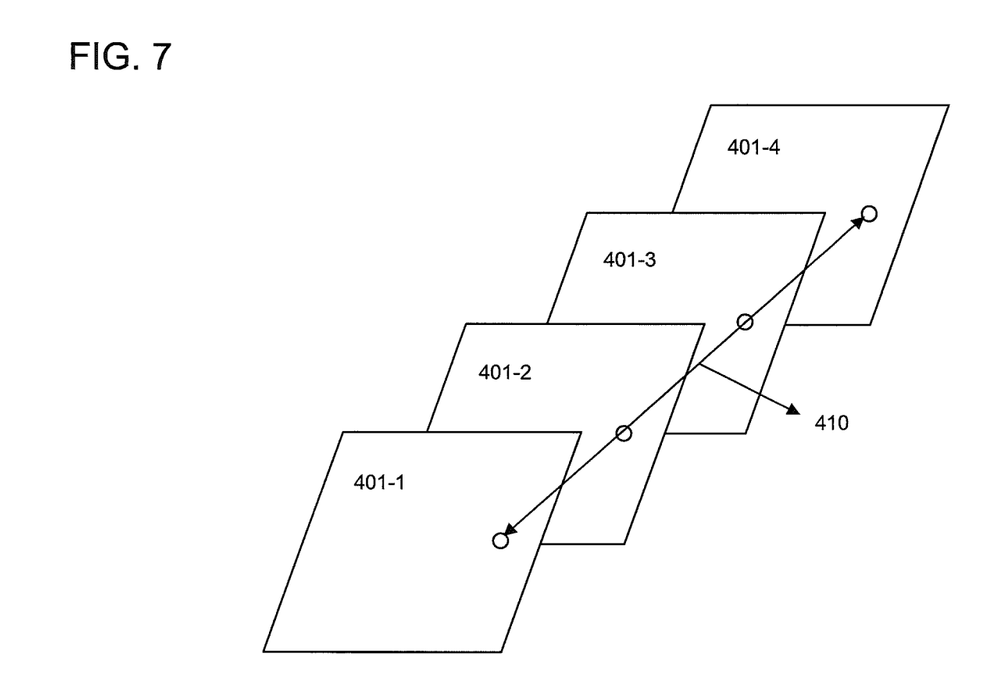
FIG. 7 illustrates a pixel wise discrete cosine transform (DCT) in a temporal direction according to an embodiment of the present invention.

FIG. 7 illustrates the pixel wise DCT in a temporal direction according to an embodiment of the present invention. For example, FIG. 10 illustrates frames 401-1 to 401-4, where a candidate pixel is chosen from one frame (401-1), and corresponding pixels from the same location are selected in the other frames, which is indicated by arrow 410 connecting these pixels. The video decoder 205 performs the DCT function on each of these pixels in the manner indicated by the arrow 410. As a result of performing the DCT function, the video decoder 205 obtains time domain DCT coefficients of a particular frequency.

Next, the video decoder 205 performs the total variation on top of the results of the pixel wise DCT on a frame by frame basis. For example, as shown below, $TV_s(z)$ is the 2D total variation of the matrix z defined as:

$$TV_s(z) = \sum_{i,j,k} \sqrt{(z_{i+1,j,k} - z_{i,j,k})^2 + (z_{i,j+1,k} - z_{i,j,k})^2}$$

for isotropic total variation, or $$TV_s(z) = \sum_{i,j,k} |z_{i+1,j,k} - z_{i,j,k}| + |z_{i,j+1,k} - z_{i,j,k}|$$

for anisotropic total variation.

Figure 8:
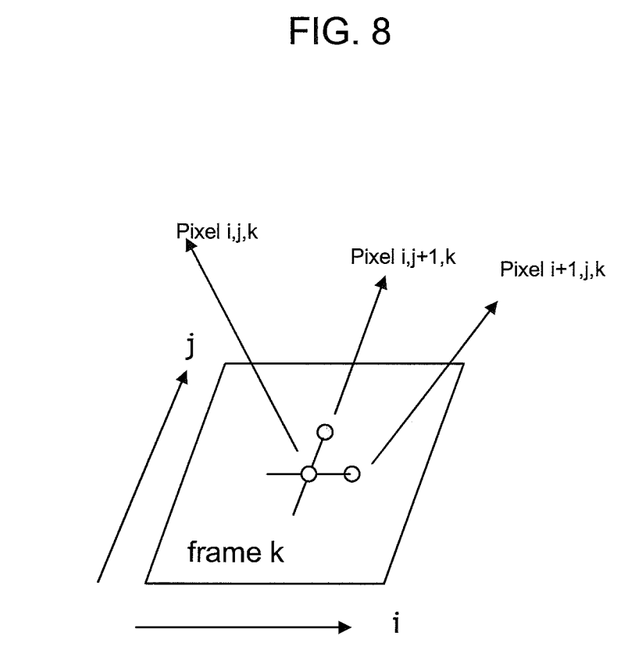
FIG. 8 illustrates anisotropic total variation and isotropic total variation according to an embodiment of the present invention.

FIG. 8 illustrates the TV function for anisotropic total variation or isotropic total variation according to an embodiment of the present invention. Anisotropic or isotropic are different types of total variation, where embodiments of the present invention encompass either the anisotropic total variation or the isotropic total variation.

FIG. 8 includes a frame that has three pixels, (i,j,k), (i,j+1,k) and (i+1,j,k). A description of the $TV_2$ function being applied to arbitrary pixel i,j,k is discussed below. However, it is noted that the three pixels illustrated in FIG. 8 are for explanation purposes only. In reality, the frame includes a number of pixels, and the $TV_2$ function is applied to each pixel in the frame, as well as the other frames on a frame-by-frame basis. For example, for anisotropic total variation, the video decoder 205 calculates an absolute value of the difference between pixel i,j,k and the next vertical pixel i,j+1,k and an absolute value of the difference between pixel i,j,k and the next vertical pixel i+1,j,k, and adds both absolute values together. This calculation is then performed for each pixel in the frame, where values outside the frame are given an arbitrary value such as zero. The process repeats itself for each frame. In above, i is the index for the horizontal pixels of a frame, j is the index of vertical pixels and k is the index for the frames in a video cube. For isotropic total variation, the video decoder 205 squares the difference between pixel i,j,k and the next vertical pixel i,j+1,k and squares the difference between pixel i,j,k and the next vertical pixel i+1,j,k. The results of this calculation are then added, where the square root is performed on the results of the addition. This calculation is then performed for each pixel in the frame, where values outside the frame are given an arbitrary value such as zero. The process repeats itself for each frame.

The video decoder 205 may include a TV minimization solver (TVAL3) for solving Equation 1 or Equation 2. For instance, TVAL3 is based on an augmented Larangian method and alternating minimization.

According to an alternative embodiment, the video encoder 202 constructs a measurement matrix A from Kronecker products. The Kronecker products may be small sensing matrices and structured permutation matrices in order to simplify the minimization problem for decoding in the video decoder 205. As such, a different minimization equation is provided below to reduce the complexity at the video decoder 205, which is based on the Kronecker based measurement matrix. Specifically, the measurement matrix A may be constructed according to the process described below.

First, the encoding level k is specified, which determines the lowest resolution the video decoder 205 can reconstruct from the measurements: $(p/2^k) \times (q/2^k)$. For the convenience of description, the dimension is an integer and the inputs are compatible to each other.

Second, a series of permutation matrices $P_1^n, P_2^n, \ldots, P_k^n$, named block-wise vectorized permutations are constructed as follows: $P_i^n = P_{i-1}^{n/4} \otimes I_4$ for $1 < i \leq k$, where $P_i^2 \in R^{s \times s}$ and $I_4$ represent the $4 \times 4$ identity matrix. Initially, $P_1^s$ is the vectorized permutation based on $2 \times 2$ blocks. For example, $P_1^{16}$ operates as shown below in following Table 1.

TABLE 1

The description of the superscript of $P_i^s$ is omitted for simplicity. The size of the identity matrix is determined by properly forming matrix products.

Third, a series of small sensing matrices $A_0 \in R^{m_0 \times (n/4^k)}$ and $A_i \in R^{m_i \times 4}$ for $1 \leq i \leq k$, are selected, which satisfy the following equation:

$$\prod_0^{i=k} m_i = m \text{ and } 4 \geq m_1 \geq \ldots \geq m_k \geq 1.$$

Usually, the choice of $m_0, m_1, \ldots, m_k$ is not unique, but $m_0$ is equal to $n/4^k$ or as large as possible to guarantee the recoverability at the relatively low resolution.

Fourth, the equations $Q_k = P_k P_{k-1} \ldots P_1$ and $A = (A_0 \otimes A_1 \otimes \ldots \otimes A_k) Q_k$ are formulated, which gives the measurement matrix for uniform encoding/multiscale decoding scheme.

This structured measurement matrix can lead to the reduction of decoding complexity. For example, Level 1 ($l \leq k$) decoding refers to the resolution of the recovered video frame being $(p/2^l) \times (q/2^l)$ and $U_l \in R^{(p/2^l) \times (q/2^l) \times r}$ denotes the level/low resolution approximation of a frame U. Vectors x and $x_l$ represent the vectorizations of U and $U_l$, respectively. Furthermore, $1_{s \times t}$ represents a $s \times t$ matrix whose entries are 1 everywhere. The second dimension of subscript t can be omitted if t=1. $B^{\circ j}$ denotes the j-degree power of Kronecker product; i.e., $$B^{\circ j} = \underbrace{B \otimes \ldots \otimes B}_{j}.$$

One way to approximate U is $U \approx U_l \otimes 1_{2^l \times 2^l}$, which is equivalent to $P_l \ldots P_1 x \approx x_l \otimes 1_{4^l} = x_l \otimes 1_4^{\circ l}$. Therefore, the Expansion matrix E can be determined as follows: $Ex_l = P_1^T \ldots P_l^T(x_l \otimes 1_4^{\circ l})$. This equation produces $AEx_l = A(P_1^T \ldots P_l^T(x_l \otimes 1_4^{+l}))$. From these equations the following is derived.

$$AEx_l = (A_0 \otimes A_1 \otimes \ldots \otimes A_k) \cdot Q_k(P_1^T \ldots P_l^T(x_l \otimes 1_4^{\circ l}))$$
$$= (A_0 \otimes A_1 \otimes \ldots \otimes A_k) \cdot P_k \ldots P_{l+1}(x_l \otimes 1_4^{\circ l})$$
$$= (A_0 \otimes A_1 \otimes \ldots \otimes A_k)((P_{k-l} \otimes I_4^{\circ l}) \ldots (P_1 \otimes I_4^{\circ l})(x_l \otimes 1_4^{\circ l}))$$
$$= (A_0 \otimes A_1 \otimes \ldots \otimes A_k) \cdot ((P_{k-l} \ldots P_1 x_l) \otimes (I_4^{\circ l} \ldots I_4^{\circ l} 1_4^{\circ l}))$$
$$= ((A_0 \otimes \ldots \otimes A_{k-l}) \otimes A_{k-l+1} \ldots \otimes A_k) \cdot$$
$$((P_{k-l} \ldots P_1 x_l) \otimes 1_4^{\circ l})$$
$$= ((A_0 \otimes \ldots \otimes A_{k-l})P_{k-l} \ldots P_1 x_l) \otimes (A_{k-l+1} 1_4) \ldots \otimes (A_k 1_4).$$

Let $L_k^j = (A_0 \otimes \ldots \otimes A_{k-})P_{k-1} \ldots P_1$ and $a_j = A_j 1_4$ for $j \leq k$. Then, the minimization problems (e.g., Equation 1 and Equation 2) described previously is equivalent to the following level 1 decoding model:

$$\min_x \Phi(x_l) + \frac{\mu}{2} \|(L_k^l x_l) \otimes a_{k-l+1} \otimes \ldots \otimes a_k - y\|_2^2. \quad \text{Equation 3}$$

The appropriate solver such as the alternate direction augmented Lagrangian method may be implemented as a solver for 2D TV minimization problems and can be extended to handle higher dimensional problems. The complexity of this algorithm is dominated by 2 matrix-vector multiplications at each iteration, which is proportional to the size of $L_k^l$. As a matter of fact, $$L_k^l \in R^{(\prod_0^{i=k-l} m_i) \times (n/4^l)}$$

corresponds to the desired resolution $(p/2^l) \times (q/2^l)$ only instead of the original resolution $p \times q$. Therefore, the uniform encoding/multi-scale decoding scheme is able to provide low complexity and scalable elapsed time.

The video decoder 205 may implement an appropriate solver for any of Equations 1, 2 and 3, or any variation of these equations in order to compute the pixel values for the reconstructed video data.

Referring back to FIG. 5, the video decoder 105 reconstructs the video data according to the reduced display resolution based on the calculated pixel values. The components of u are the pixel values of the reconstructed video cube. For example, the video frame can be formed from u by taking the components of u to form the pixels of the video frame column by column and then frame by frame. However, embodiments of the present invention encompass any type of method that reconstructs video frames (or a particular structure of a video frame such as video cubes or tubes) from a set of values. This process must be exactly the inverse of the process in which the vector x is formed from the video frame when the measurements are made.

The destination device 103 displays the video data on the video display 206.

The reconstruction process described above may provide high quality reconstruction, and accurate reconstructed video data with a relatively high PSNR. Also, embodiment of the present invention may have a higher error resilience, increased compression ratio, faster reconstruction, and lower complexity than the traditional methods described in the background of the disclosure.

Variations of the example embodiments of the present invention are not to be regarded as a departure from the spirit and scope of the example embodiments of the invention, and all such variations as would be apparent to one skilled in the art are intended to be included within the scope of this invention.

What is claimed:

1. A method for decoding video data by a video decoder, the method including:
   receiving, by the video decoder, at least one measurement of a set of measurements that was generated at an encoder by applying compressive sampling, the set of measurements representing encoded video data;
   determining, by the video decoder, a display resolution, the display resolution being same or different than an original display resolution;
   determining, by the video decoder, an expansion matrix based on at least a number of pixels for the determined display resolution;
   reconstructing, by the video decoder, the video data using the at least one received measurement and the determined expansion matrix such that a display resolution is resized from the original display resolution to the determined display resolution if the determined display resolution is different than the original display resolution; and
   obtaining, by the video decoder, a measurement matrix that was applied to the video data at the encoder, the measurement matrix including an assigned pattern of pixel values.

2. The method of claim 1, wherein the determining the display resolution determines the display resolution according to requirements of a video display screen.

3. The method of claim 1, wherein the determining the display resolution determines the display resolution according to a number of measurements of the received at least one measurement.

4. The method of claim 1, further comprising:
   calculating, by the video decoder, pixel values for the determined display resolution according to a total variation (TV) of discrete cosine transform (DCT) coefficients of candidate video data, the candidate video data being based on the measurement matrix, the determined expansion matrix, and the received at least one measurement.

5. The method of claim 1, wherein the determined expansion matrix includes a pattern of values, and
   wherein the pattern of values of the determined expansion matrix represents a low pass filter.

6. The method of claim 1, wherein the determined expansion matrix includes a pattern of values, and
   wherein the pattern of values of the determined expansion matrix is calculated using a discrete cosine transform (DCT) of the encoded video data.

7. The method of claim 1, wherein the determined expansion matrix includes a pattern of values, and
   wherein the pattern of values of the determined expansion matrix is calculated using wavelet transform of the encoded video data.

8. The method of claim 4, wherein the TV is one of anisotropic TV and isotropic TV.

9. The method of claim 4, wherein the calculating the pixel values further includes:
   determining, by the video decoder, the DCT coefficients in a temporal direction of the candidate video data; and determining, by the video decoder, the TV of the DCT coefficients on a frame-by-frame basis, wherein the calculating the pixel values calculates a set of values according to a minimization of the TV of the DCT coefficients.

10. The method of claim 9, wherein the assigned pattern of pixel values of the measurement matrix is constructed based on a lowest display resolution the video decoder can reconstruct from the received at least one measurement.

11. An apparatus for decoding video data, the apparatus including:
a decoder configured to receive at least one measurement of a set of measurements that was generated at an encoder by applying compressive sampling, the set of measurements representing encoded video data,
the decoder configured to determine a display resolution, the display resolution being same or different than an original display resolution,
the decoder configured to determine an expansion matrix based on at least a number of pixels for the determined display resolution,
the decoder configured to reconstruct the video data using the at least one received measurement and the determined expansion matrix such that a display resolution is resized from the original display resolution to the determined display resolution if the determined display resolution is different than the original display resolution, and
the decoder configured to obtain a measurement matrix that was applied to the video data at the encoder, the measurement matrix including an assigned pattern of pixel values.

12. The apparatus of claim 11, wherein the decoder determines the display resolution according to requirements of a video display screen.

13. The apparatus of claim 11, wherein the decoder determines the display resolution according to a number of measurements of the received at least one measurement.

14. The apparatus of claim 11, further comprising:
the decoder configured to calculate pixel values for the determined display resolution according to a total variation (TV) of discrete cosine transform (DCT) coefficients of candidate video data, the candidate video data being based on the measurement matrix, the determined expansion matrix, and the received at least one measurement.

15. The apparatus of claim 11, wherein the determined expansion matrix includes a pattern of values, and
wherein the pattern of values of the determined expansion matrix represents a low pass filter.

16. The apparatus of claim 11, wherein the determined expansion matrix includes a pattern of values, and
wherein the pattern of values of the determined expansion matrix is calculated using a discrete cosine transform (DCT) of the encoded video data.

17. The apparatus of claim 11, wherein the determined expansion matrix includes a pattern of values, and
wherein the pattern of values of the determined expansion matrix is calculated using wavelet transform of the encoded video data.

18. The apparatus of claim 14, wherein the TV is one of anisotropic TV and isotropic TV.

19. The apparatus of claim 14, further including:
the decoder configured to determine the DCT coefficients in a temporal direction of the candidate video data, and
the decoder configured to determine the TV of the DCT coefficients on a frame-by-frame basis, wherein the decoder calculates a set of values according to a minimization of the TV of the DCT coefficients.

20. The apparatus of claim 19, wherein the assigned pattern of pixel values of the measurement matrix is constructed based on a lowest display resolution the decoder can reconstruct from the received at least one measurement.

* * * * *